United States Patent
Lin et al.

(10) Patent No.: US 10,636,507 B2
(45) Date of Patent: Apr. 28, 2020

(54) MEMORY-TESTING METHODS FOR TESTING MEMORY HAVING ERROR-CORRECTING CODE

(71) Applicant: Winbond Electronics Corp., Taichung (TW)

(72) Inventors: Lih-Wei Lin, Hsinchu (TW); Tsung-Huan Tsai, Taichung (TW); Ju-Chieh Cheng, Hemei Township, Changhua County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 99 days.

(21) Appl. No.: 16/003,523

(22) Filed: Jun. 8, 2018

(65) Prior Publication Data
US 2019/0378586 A1 Dec. 12, 2019

(51) Int. Cl.
*G11C 29/10* (2006.01)
*G11C 29/12* (2006.01)
*G06F 12/02* (2006.01)

(52) U.S. Cl.
CPC .......... *G11C 29/10* (2013.01); *G06F 12/0223* (2013.01); *G11C 29/1201* (2013.01); *G06F 2212/1008* (2013.01)

(58) Field of Classification Search
None
See application file for complete search history.

(56) References Cited

U.S. PATENT DOCUMENTS

| 6,992,937 B2* | 1/2006 | Tran ..................... G11C 29/027 365/189.08 |
| 8,407,406 B2* | 3/2013 | Tanaka ................... G11C 29/28 711/103 |
| 2018/0102183 A1* | 4/2018 | Shim ...................... G11C 29/36 |

* cited by examiner

*Primary Examiner* — Phung M Chung
(74) *Attorney, Agent, or Firm* — Muncy, Geissler, Olds & Lowe, P.C.

(57) ABSTRACT

A memory-testing method is adapted in a memory circuit including a first block and a second block including a plurality of row addresses and column addresses. The memory-testing method includes: selecting one of the row addresses and one of the column addresses as a testing row and a testing column according to selection logic; selecting sampled column addresses of the testing row and sampled row addresses of the testing column according to a sampling process; executing the read operation on the sampled column addresses of the testing row and the sampled row addresses of the testing column in the first block; determining whether the read fail rate of the first block exceeds a predetermined ratio; and marking the first block as an input/output fail when the read fail rate exceeds the predetermined ratio.

14 Claims, 7 Drawing Sheets

MEMORY-TESTING METHODS FOR TESTING MEMORY HAVING ERROR-CORRECTING CODE

BACKGROUND OF THE INVENTION

Field of the Invention

The disclosure relates generally to memory-testing methods, and more particularly it relates to memory-testing methods for testing memory having error-correcting code (ECC).

Description of the Related Art

Generally speaking, emerging memory allows an error rate of one or several bits. Therefore, when there is more than one bit of I/O fail in a memory circuit during a testing process, the testing system will determine that the memory circuit is normal, making it impossible to identify the I/O fail.

I/O fail is a continuous fail for a memory circuit, which means that a read error will occur all the time, after a bit is read. However, an I/O fail always comes from the peripheral circuits of a memory array. Although the data stored in the memory circuit with an I/O fail can still be recovered using ECC technology, the reliability of the memory circuit is still influenced by the I/O fail.

In addition, current memory-testing methods cannot identify an I/O fail, so these memory-testing methods should be improved in order to be able to identify an I/O fail in the emerging memory.

BRIEF SUMMARY OF THE INVENTION

In an embodiment, a memory-testing method adapted to a memory circuit is provided. The memory circuit includes a first block and a second block. The first block and the second block comprise a plurality of row addresses and a plurality of column addresses. The memory-testing method comprises: selecting one of the row addresses as a tested row according to selection logic; selecting one of the column addresses as a tested column according to the selection logic; selecting a plurality of sampled column addresses on the tested row according to a sampling procedure; selecting a plurality of sampled row addresses on the tested column according to the sampling procedure; executing a read operation on the sampled column addresses on the tested row of the first block; executing the read operation on the sampled row addresses on the tested column of the first block; determining whether the read fail rate of the read operation executed on the first block exceeds a predetermined ratio; and when the read fail rate exceeds the predetermined ratio, marking the first block as an input/output fail.

In an embodiment, a memory-testing method adapted in a memory circuit is provided. The memory circuit comprises a first block and a second block. The first block and the second block comprise a plurality of row addresses and a plurality of column addresses. The memory-testing method comprises: selecting one of the row addresses to be a tested row according to selection logic; selecting one of the column addresses as a tested column according to the selection logic; selecting a plurality of sampled column addresses on the tested row according to a sampling procedure; selecting a plurality of sampled row addresses on the tested column according to the sampling procedure; simultaneously executing a read operation on the sampled column addresses on the tested row of the first block and the second block; simultaneously executing the read operation on the sampled row addresses on the tested column of the first block and the second block; determining whether the read fail rate of the read operation executed on the memory circuit is 0; when the read fail ratio of the memory circuit is not 0, determining whether the read fail ratio of the first block and/or the second block exceeds a predetermined ratio; and when the read fail ratio of the first block and/or the second block exceeds the predetermined ratio, marking the first block and/or the second block as a solid input/output fail.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
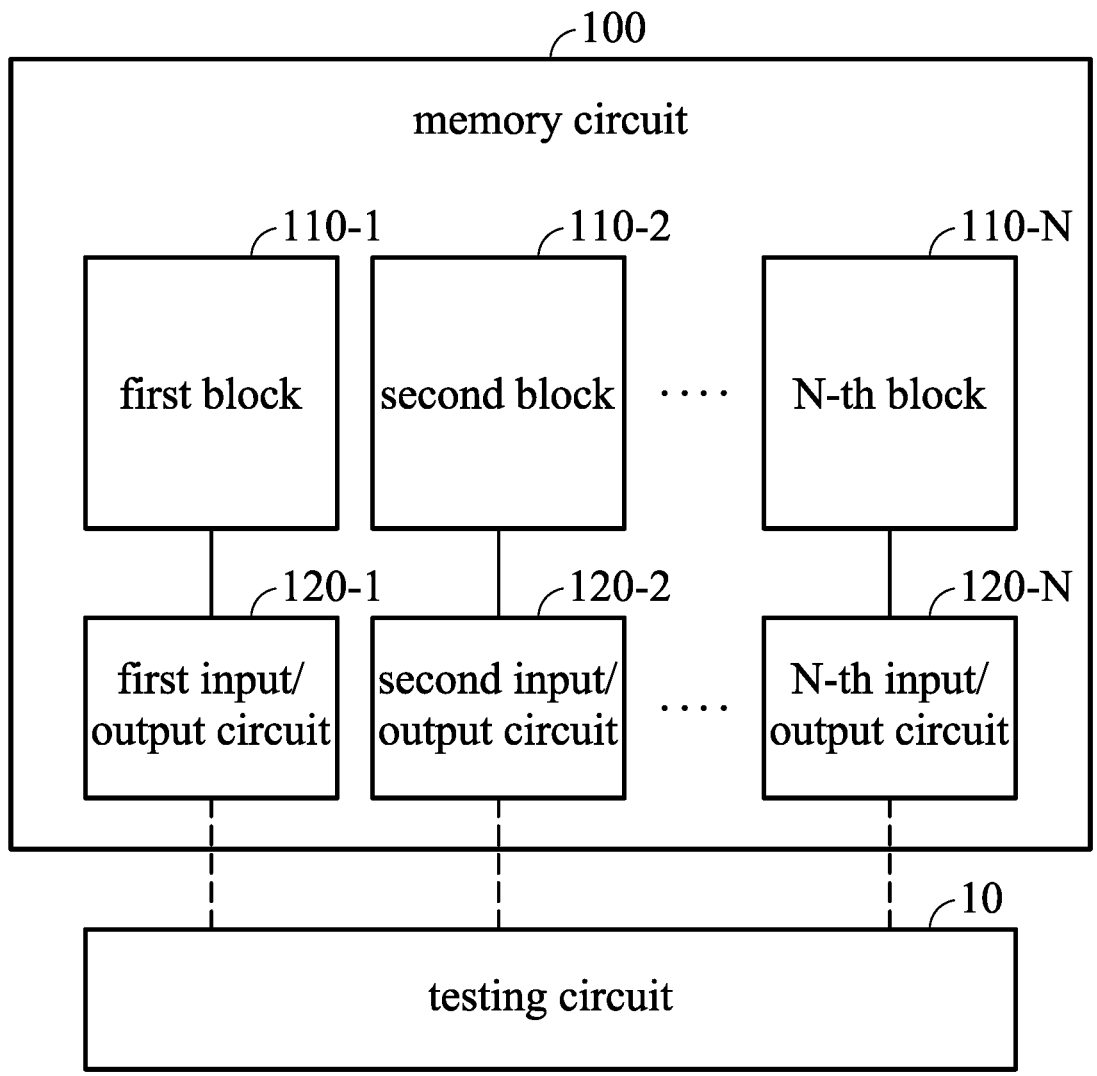
FIG. 1 is a block diagram of a memory circuit in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed by interposing the features in such a way that the features may not be in direct contact.

FIG. 1 is a block diagram of a memory circuit in accordance with an embodiment of the invention. As shown in FIG. 1, the memory circuit 100 includes a first block 110-1, a second block 110-2, ..., and an N-th block 110-N. The first block 110-1, the second block 110-2, ..., and the N-th block 110-N form a memory array, and the first block 110-1, the second block 110-2, ..., and the N-th block 110-N are coupled to a first input/output circuit 120-1, a second input/output circuit 120-2, ..., and a N-th input/output circuit 120-N respectively.

According to an embodiment of the invention, the memory circuit 100 may be an emerging memory having ECC, which includes a NAND flash, a MRAM (Magnetoresistive Random Access Memory), a FeRAM (Ferro electric Random Access Memory), and etc.

The memory circuit 100 is coupled to a testing circuit 10. The testing circuit 10 accesses the data stored in the first block 110-1, the second block 110-2, ..., and the N-th block 110-N through the first input/output circuit 120-1, the second input/output circuit 120-2, ..., and the N-th input/output circuit 120-N respectively.

According to an embodiment of the invention, the testing circuit 10 may be a piece of testing equipment configured for chip probing (CP) or final test (FT), in which the final test is a test conducted after packaging and the memory circuit 100 and the testing circuit 10 are physically separated. According to another embodiment of the invention, the testing circuit 10 is a built-in self-test (BIST) circuit in the memory circuit 100, and the testing circuit 10 and the memory circuit 100 are placed on the same die or wafer.

According to an embodiment of the invention, the testing circuit 10 individually executes the read operation on each of the first block 110-1, the second block 110-2, ..., and the N-th block 110-N. According to another embodiment of the invention, the testing circuit 10 may simultaneously execute a read operation on the first block 110-1, the second block 110-2, ..., and the N-th block 110-N, which is not intended to be limited thereto.

Figure 2:
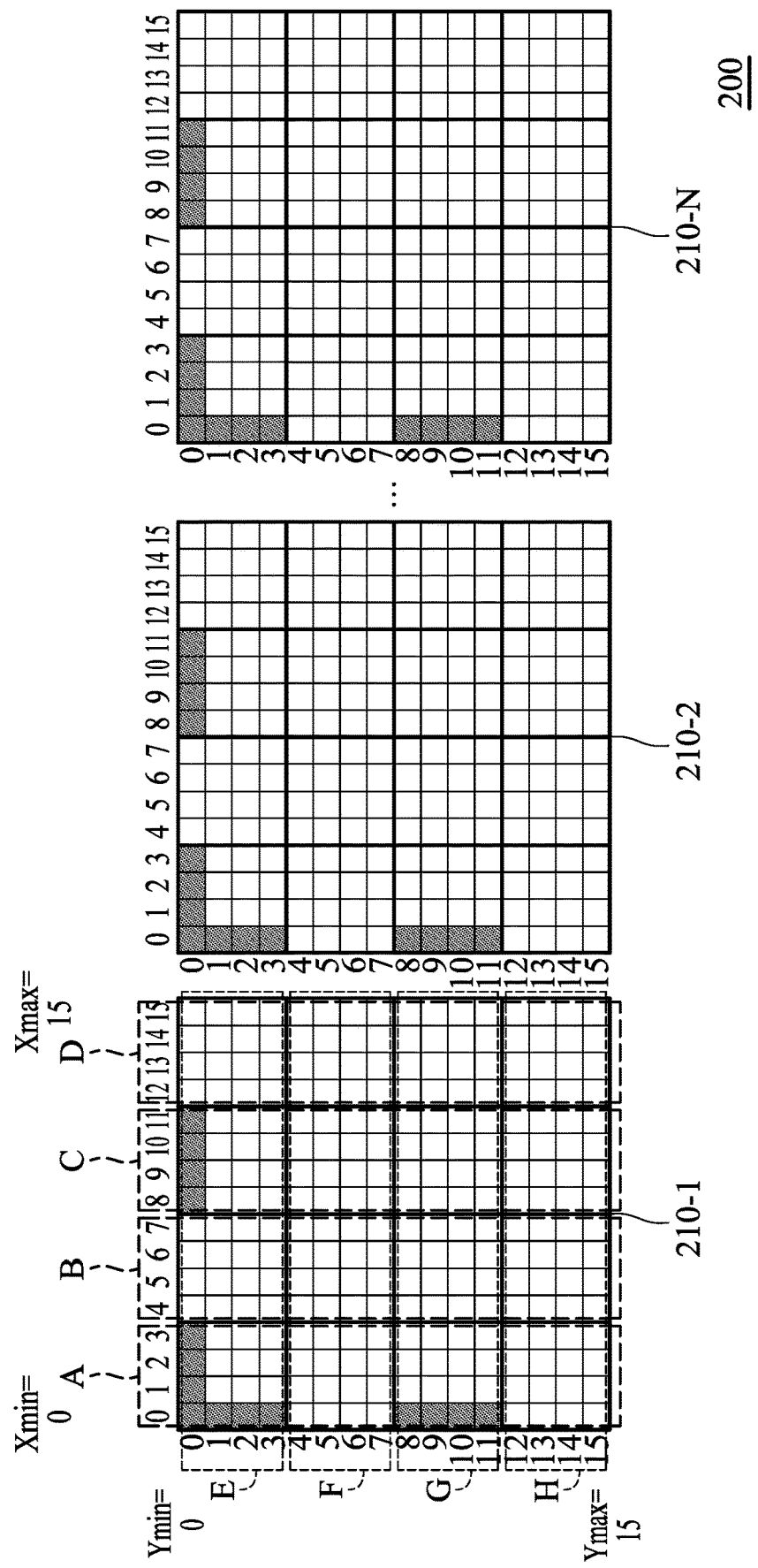
FIG. 2 is a schematic diagram of a memory array in accordance with an embodiment of the invention.

FIG. 2 is a schematic diagram of a memory array in accordance with an embodiment of the invention. As shown in FIG. 2, the memory array 200 includes a first block 210-1, a second block 210-2, ..., and an N-th block 210-N which have the same column address X and row address Y. For example, when a column address X and a row address Y are selected to be read, the corresponding bit of the first block 210-1, the second block 210-2, ..., and the N-th block 210-N is read, and N bits of read data are generated.

According to an embodiment of the invention, the column address X of the memory array 200 is from 0 to 15, and the row address Y is from 0 to 15, which indicates that each of the first block 210-1, the second block 210-2, ..., and the N-th block 210-N has 256 memory units. It should be noted that the number of column address X and the row address is merely illustrated but not intended to be limited thereto.

Figure 3:
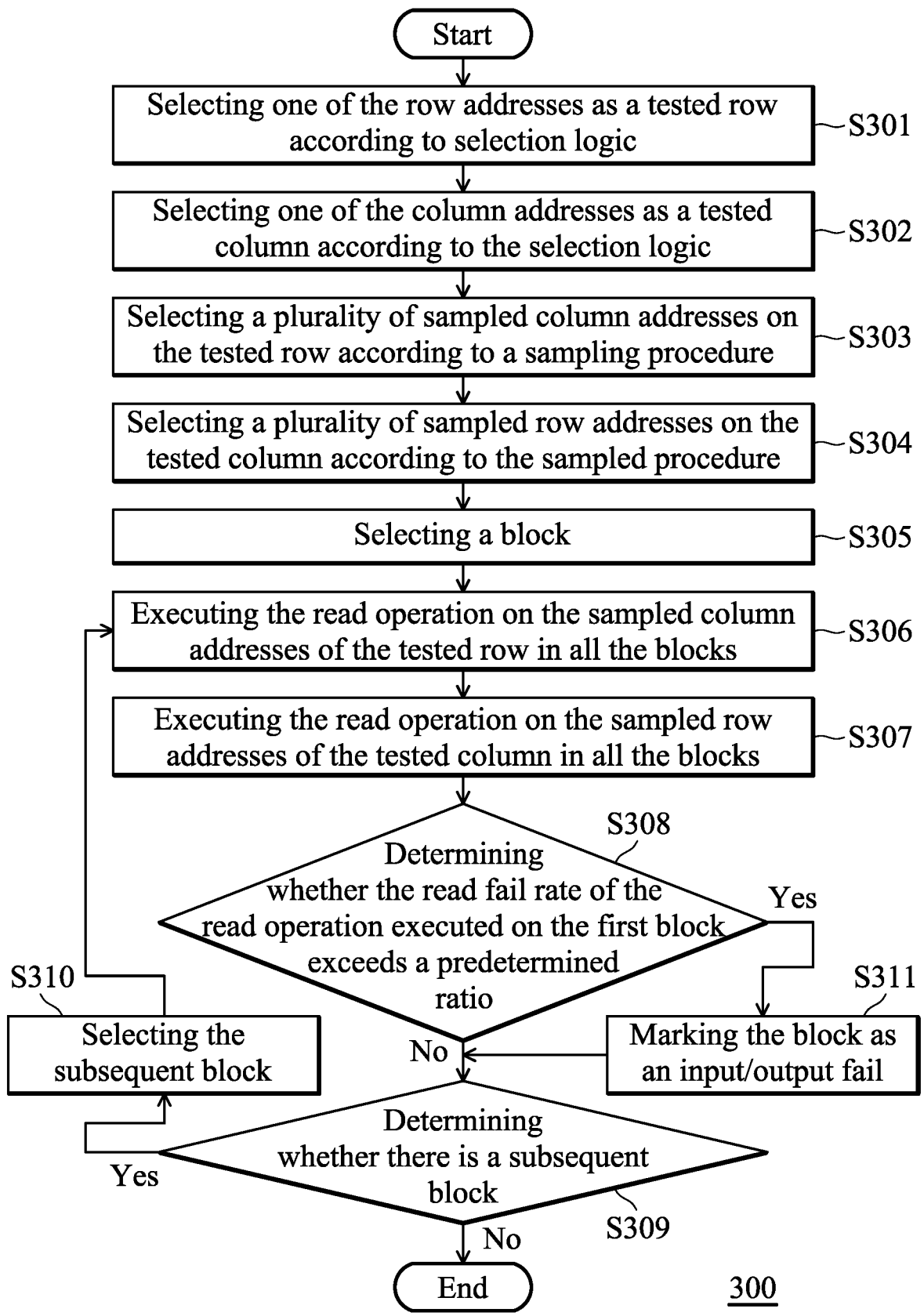
FIG. 3 is a flow chart of a memory-testing method in accordance with an embodiment of the invention.

FIG. 3 is a flow chart of a memory-testing method in accordance with an embodiment of the invention. The description of the flow chart in FIG. 3 will be accompanied with FIG. 2 for the simplicity of explanation. As shown in FIG. 3, one of the row addresses is selected as a tested row according to selection logic (Step S301), and one of the column addresses is selected as a tested column according to the selection logic (Step S302).

According to an embodiment of the invention, the selection logic may be random. According to other embodiments of the invention, any selection logic may be used to select a tested row and a tested column. According to another embodiment of the invention, two or more tested rows and tested columns may be selected respectively. One tested row and one tested column are illustrated herein for explanation.

According to an embodiment of the invention, Step S301 in FIG. 3 is configured to select the row address Y in FIG. 2 being 0 to be the tested row, and Step S302 in FIG. 3 is configured to select the column address X in FIG. 2 being 0 to be the test column. According to other embodiments of the invention, other row address Y may be selected to be the tested row, and other column address X may be selected to be the tested column. A plurality of row addresses Y and a plurality of column addresses X may be selected to be the tested rows and the tested columns. It is merely illustrated herein that the row address Y being 0 is selected to be the tested row and the column address X being 0 is selected to be the tested column, but not intended to be limited thereto.

Back to FIG. 3, a plurality of sampled column addresses on the tested row are selected according to a sampling procedure (Step S303). According to an embodiment of the invention, as shown in FIG. 2, the row with the row address Y being 0 is selected to be the tested row, and the column address X being 0-3 and 8-11 are selected to be the sampled column addresses according to the sampling procedure. A plurality of sampled row addresses on the tested column are selected according to the sampled procedure (Step S304). According to an embodiment of the invention, as shown in FIG. 2, the column with the column address X being 0 is the tested column, and the row address Y being 0-3 and 8-11 are selected to be the sampled row addresses.

Figure 4:
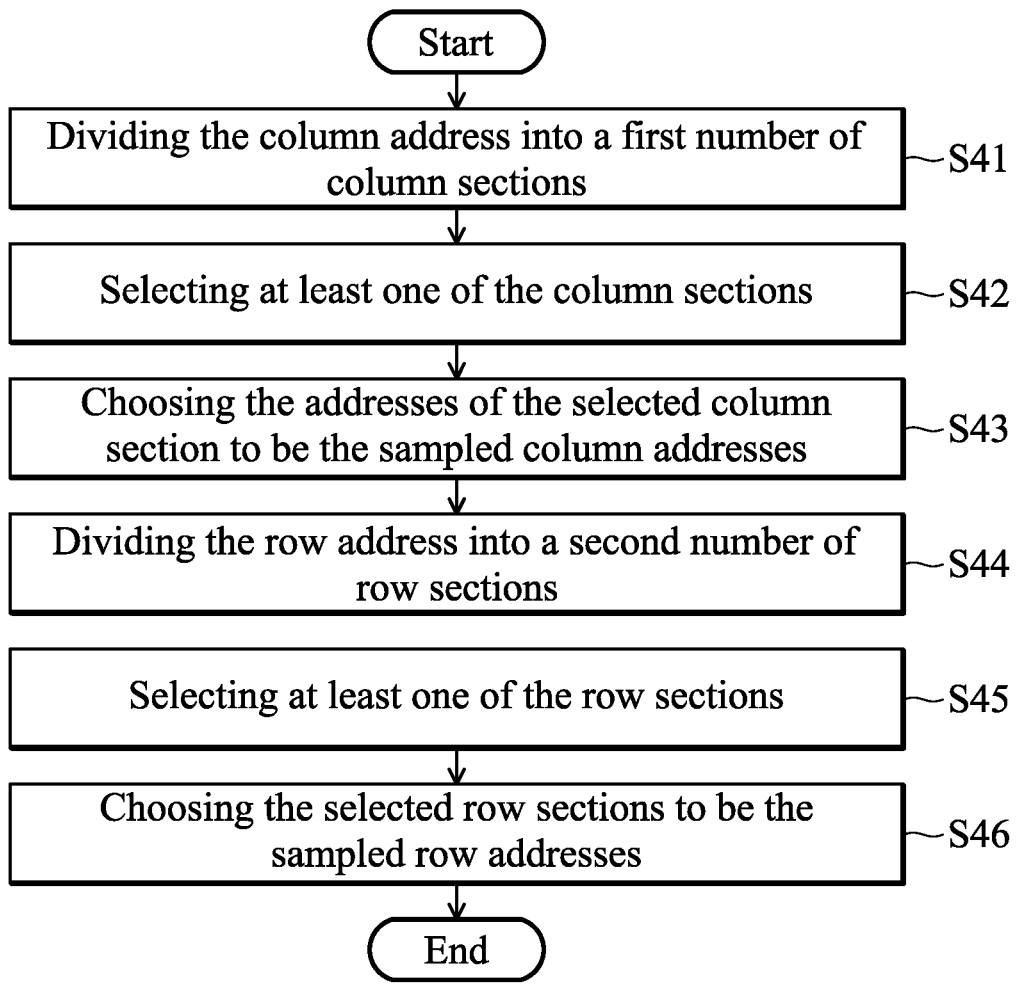
FIG. 4 shows a flow chart of a sampling procedure in accordance with an embodiment of the invention.

FIG. 4 shows a flow chart of a sampling procedure in accordance with an embodiment of the invention. As shown in FIG. 4, the column address X is divided into a first number of column sections (Step S41). As shown in the embodiment of FIG. 2, the column address X is divided into 4 column sections, which are the first column section A, the second column section B, the third column section C, and the fourth column section D. According to other embodiments of the invention, the column address X may be divided into any number of column sections which may not be equally divided. It is merely illustrated herein for explanation but not intended to be limited thereto.

Then, at least one of the column sections is selected (Step S42). As shown in the embodiment of FIG. 2, the first column section A and the third column section C are selected, in which the selected first column section A and third column section C are interlaced with the unselected second column section B and fourth column section D. according to other embodiments of the invention, only any one of the first column section A, the second column section B, the third column section C, and the fourth column section D may be selected, or at least one of the first column section A, the second column section B, the third column section C, and the fourth column section D may be selected, which is illustrated herein for explanation but not intended to be limited thereto.

Back to FIG. 4, the addresses of the selected column section are chosen to be the sampled column addresses (Step S43). As shown in the embodiment of FIG. 2, the sampled column addresses may be the column address X of the first column section A and the third column section C, which are 0-3 and 8-11.

Then, the row address Y is divided into a second number of row sections (Step S44). As shown in the embodiment of FIG. 2, the row address Y is divided into 4 row sections, which are the first row section E, the second row section F, the third row section G, and the fourth row section H. According to other embodiments of the invention, the row address Y may be divided into any number of row sections which may not be equally divided. According to an embodiment of the invention, the first number is equal to the second number. According to another embodiment of the invention, the first number is different from the second number. It is merely illustrated herein for explanation, but not intended to be limited thereto.

Back to FIG. 4, at least one of the row sections is selected (Step S45). As shown in the embodiment of FIG. 2, the first row section E and the third row section G are selected, in which the selected first row section E and third row section G are interlaced with the unselected second row section F and fourth row section H. According to other embodiments of the invention, any one of the first row section E, the second row section F, the third row section G, and the fourth row section H may be selected, or at least one of the first row section E, the second row section F, the third row section G, and the fourth row section H may be selected, which is illustrated herein for explanation but not intended to be limited thereto.

Back to FIG. 4, the selected row sections are chosen to be the sampled row addresses (Step S46). As shown in the embodiment of FIG. 2, the sampled row addresses are the row address Y of the first row section E and the third row section G, which are 0-3 and 8-11.

Back to FIG. 3, a block is selected (Step S305). The designer may first select any one of the first block 210-1, the second block 210-2, ..., and the N-th block 210-N. It is illustrated in the following paragraphs that the first block 210-1 are first selected, but not intended to be limited thereto. The sampled column addresses in the tested row of the selected first block 210-1 are executed the read operation (Step S306), and the sampled row addresses in the tested column of the selected first block 210-1 are executed the read operation (Step S307).

When the first block 210-1 is executed the read operation, it is determined whether the read fail rate of the read operation executed on the first block 210-1 exceeds a predetermined ratio (Step S308). According to an embodiment of the invention, the predetermined ratio is 70%. According to other embodiments of the invention, the designer could determine the predetermined ratio.

Back to Step S308, when it is determined that the read fail rate of the read operation executed on the first block 210-1 does not exceed the predetermined ratio, it is determined whether there is a subsequent block (Step S309). When there is a subsequent block, the subsequent block is selected (Step S310) and Step S306 is returned. As shown in the embodiment of FIG. 2, since the read operation of the first block 210 has been executed, any one of the second block 210-2, ..., and the N-th block 210-N may be selected herein. The designer may sequentially select the blocks or selects a proper block as required, which is not intended to be limited thereto. Back to Step S309, when there is not a subsequent block, the memory-testing method 300 is terminated.

Back to Step S308, when it is determined that the read fail rate of the read operation executed on the first block 210-1 exceeds the predetermined ratio, the block is marked as an input/output fail (Step S311). According to an embodiment of the invention, when the read fail rate of the read operation executed on any one of the sampled addresses of a block is very high, this indicates that the peripheral circuits of the block may have failed, resulting in a high read fail rate. Therefore, the block should be marked as an input/output fail.

Figure 5A:
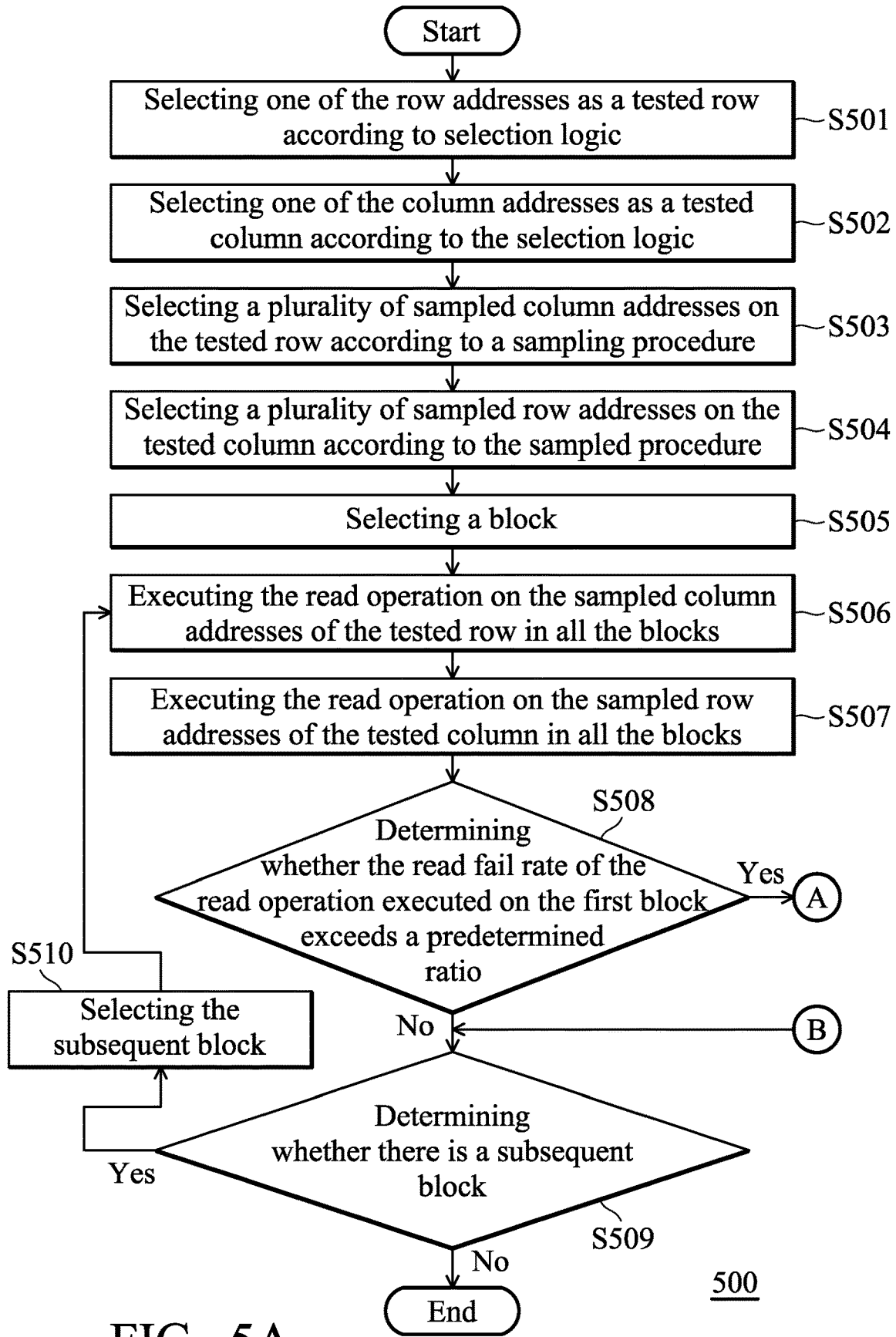
FIGS. 5A-5B show a flow chart of a memory-testing method in accordance with another embodiment of the invention.
Figure 5B:
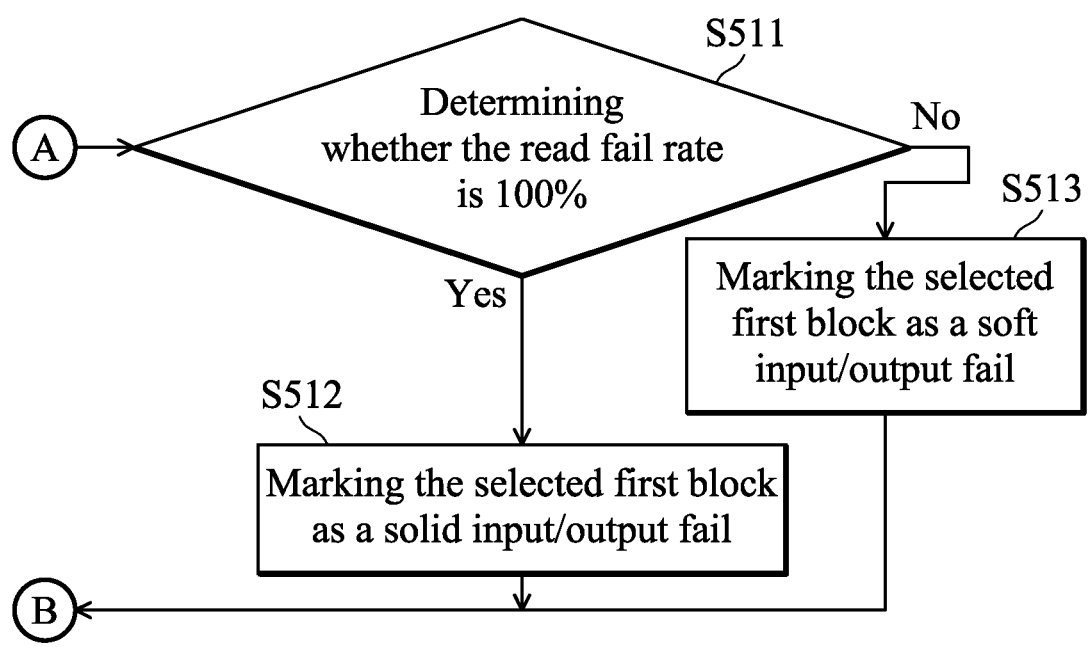

FIGS. 5A-5B show a flow chart of a memory-testing method in accordance with another embodiment of the invention. As shown in FIG. 5A, Step S501 to Step S510 in FIG. 5A are identical to Step S301 to Step S310 in FIG. 3, which are not repeated herein.

In Step S508, when it is determined that the read fail ratio of the read operation executed on the first block 210-1 does not exceed the predetermined ratio, it is further determined whether the read fail rate is 100% (Step S511). When it is determined that the read fail rate is 100%, the selected first block 210-1 is marked as a solid input/output fail (Step S512). According to an embodiment of the invention, when it is determined that the read fail rate is 100%, this indicates that the peripheral circuits of the block could not access the data stored in the block. Meanwhile, it is certain that the input/output circuit of the block has failed, and so it is marked as a solid input/output fail.

Back to Step S511, when it is determined that the read fail rate is not 100%, the selected first block 210-1 is marked as a soft input/output fail (Step S513). According to an embodiment of the invention, when a soft input/output fail is recorded, this indicates that the input/output circuit of the block is unstable, so the read operation sometimes fails and sometimes functions normally.

Figure 6:
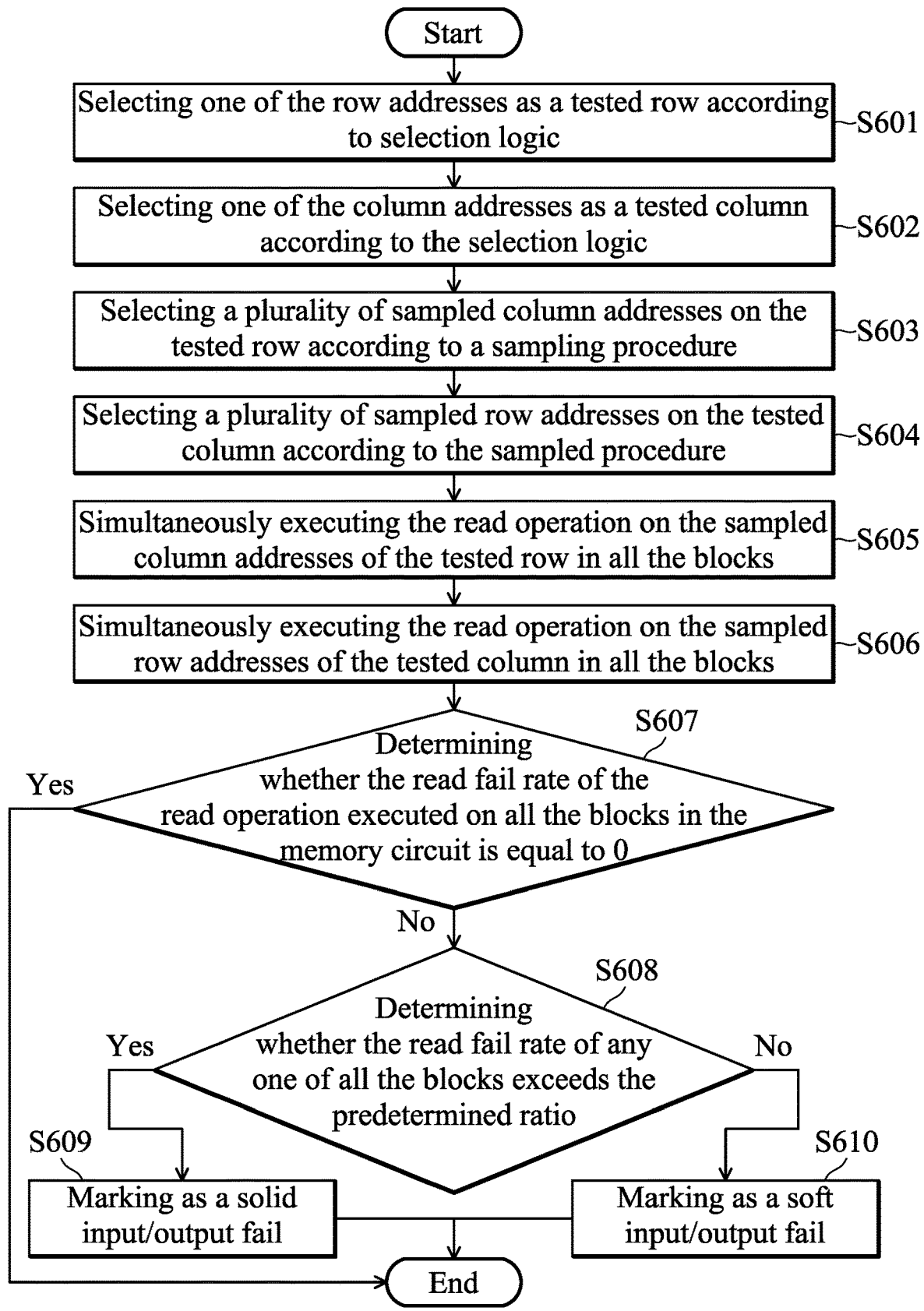
FIG. 6 shows a flow chart of a memory-testing method in accordance with yet another embodiment of the invention.

FIG. 6 shows a flow chart of a memory-testing method in accordance with yet another embodiment of the invention. As shown in FIG. 6, Step S601 to Step S604 in FIG. 6 are identical to Step S301 to Step S304 in FIG. 3 and identical to Step S501 to Step S504 in FIG. 5A, which are not repeated herein.

In Step S605, the read operation is simultaneously executed on the sampled column addresses of the tested row in the first block 210-1, the second block 210-2, ..., and the N-th block 210-N in FIG. 2. Then, the read operation is simultaneously executed on the sampled row addresses of the tested column in the first block 210-1, the second block 210-2, ..., and the N-th block 210-N in FIG. 2 (Step S606).

When the read operation on the tested row and the tested column has been executed, it is determined whether the read fail rate of the read operation executed on all the blocks in the memory circuit 100 is equal to 0 (Step S607). When the read fail rate of the memory circuit 100 is 0, this indicates that the read operation executed on all the blocks of the memory circuit 100 is completely normal, so the memory-testing method 600 can be terminated.

When it is determined that the read fail rate of the memory circuit 100 is not equal to 0, it is further determined whether the read fail rate of any one of the first block 210-1, the second block 210-2, ..., and the N-th block 210-N exceeds the predetermined ratio (Step S608). According to an embodiment of the invention, the predetermined ratio is 70%. According to another embodiment of the invention, the predetermined ratio is 100%. According to other embodiments of the invention, the predetermined ratio may be determined by the designer.

When it is determined that the read fail rate of any one of the first block 210-1, the second block 210-2, ..., and the N-th block 210-N exceeds the predetermined ratio, the block is marked as a solid input/output fail (Step S609). According to an embodiment of the invention, when the block is marked as a solid input/output fail, this indicates that the peripheral circuits of the block have malfunctioned, causing the possibility of a reading fail to be very high.

When it is determined that the read fail rate of any one of the first block 210-1, the second block 210-2, ..., and the N-th block 210-N does not exceed the predetermined ratio, the block is marked as a soft input/output fail (Step S610). According to an embodiment of the invention, when the block is marked as a soft input/output fail, this indicates that the peripheral circuits of the block are unstable, causing the read operation to sometimes fail and sometimes function normally.

Memory-testing methods are provided herein, which are configured to identify an input/output fail of the memory blocks so that the reliability of the memory could be improved.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A memory-testing method adapted to a memory circuit, wherein the memory circuit includes a first block and a second block, wherein the first block and the second block comprise a plurality of row addresses and a plurality of column addresses, wherein the memory-testing method comprises:
   selecting one of the row addresses as a tested row according to selection logic; selecting one of the column addresses as a tested column according to the selection logic; selecting a plurality of sampled column addresses on the tested row according to a sampling procedure;
   selecting a plurality of sampled row addresses on the tested column according to the sampling procedure;
   executing a read operation on the sampled column addresses on the tested row of the first block;
   executing the read operation on the sampled row addresses on the tested column of the first block;
   determining whether a read fail rate of the read operations executed on the sampled column addresses on the tested row and the sampled row addresses on the tested column of the first block exceeds a predetermined ratio; and when the read fail rate exceeds the predetermined ratio, marking the first block as an input/output fail.

2. The memory-testing method of claim 1, further comprising:
   when the read fail rate does not exceed the predetermined ratio or after the step of marking the first block as an input/output fail, executing the read operation on the sampled column addresses on the tested row of the second block; executing the read operation on the sampled row addresses on the tested column of the second block;
   determining whether the read fail rate of the read operations executed on the sampled column addresses on the tested row and the sampled row addresses on the tested column of the second block exceeds the predetermined ratio; and
   when the read fail rate exceeds the predetermined ratio, marking the second block as an input/output fail.

3. The memory-testing method of claim 2, wherein when the first block and/or the second block are marked as an input/output fail, this indicates that peripheral circuits of the first block and/or the second block have malfunctioned and that the read fail rate is very high.

4. The memory-testing method of claim 1, wherein the sampling procedure comprises:
   dividing the column addresses into a first number of column sections;
   selecting at least one of the column sections to be a selected column section, wherein the column sections other than the selected column section is an unselected column section;
   selecting the addresses of the selected column section to be the sampled column addresses;
   dividing the row addresses into a second number of row sections;
   selecting at least one of the row sections to be a selected row section, wherein the row sections other than the selected row section is an unselected row section; and
   selecting the addresses of the selected row section to be the sampled row addresses.

5. The memory-testing method of claim 4, wherein the first number is equal to the second number.

6. The memory-testing method of claim 4, wherein the step of selecting at least one of the column sections to be the selected column section further comprises:
   selecting half of the first number of column sections, wherein the selected column section is interlaced with the unselected column section.

7. The memory-testing method of claim 4, wherein the step of selecting at least one of the row sections to be the selected row section further comprises:
   selecting half of the second number of row sections, wherein the selected row section is interlaced with the unselected row section.

8. The memory-testing method of claim 1, wherein the step of determining whether the read fail rate of the read operation executed on the first block exceeds a predetermined ratio further comprises:
   determining whether the read fail rate of the first block is 100%;
   when the read fail rate is 100%, marking the first block as a solid input/output fail; and
   when the read fail rate is not 100%, marking the first block as a soft input/output fail.

9. A memory-testing method adapted in a memory circuit, wherein the memory circuit comprises a first block and a second block, wherein the first block and the second block comprise a plurality of row addresses and a plurality of column addresses, wherein the memory-testing method comprises:
   selecting one of the row addresses to be a tested row according to selection logic;
   selecting one of the column addresses as a tested column according to the selection logic;
   selecting a plurality of sampled column addresses on the tested row according to a sampling procedure;
   selecting a plurality of sampled row addresses on the tested column according to the sampling procedure;
   simultaneously executing a read operation on the sampled column addresses on the tested row of the first block and the second block;
   simultaneously executing the read operation on the sampled row addresses on the tested column of the first block and the second block;
   determining whether a read fail rate of the read operations executed on the sampled column addresses on the tested row and the sampled row addresses on the tested column of the memory circuit is 0;
   when the read fail ratio of the memory circuit is not 0, determining whether the read fail ratio of the first block and/or the second block exceeds a predetermined ratio; and when the read fail rate of the first block and/or the second block exceeds the predetermined ratio, marking the first block and/or the second block as a solid input/output fail.

10. The memory-testing method of claim 9, wherein when the first block and/or the second block are marked as an input/output fail, this indicates that peripheral circuits of the first block and/or the second block have malfunctioned and that the read fail rate is very high.

11. The memory-testing method of claim 9, wherein the sampling procedure comprises:

dividing the column addresses into a first number of column sections;

selecting at least one of the column sections to be a selected column section, wherein the column sections other than the selected column section is an unselected column section;

selecting the addresses of the selected column section to be the sampled column addresses;

dividing the row addresses into a second number of row sections;

selecting at least one of the row sections to be a selected row section, wherein the row sections other than the selected row section is an unselected row section; and selecting the addresses of the selected row section to be the sampled row addresses.

12. The memory-testing method of claim 11, wherein the first number is equal to the second number.

13. The memory-testing method of claim 11, wherein the step of selecting at least one of the column sections to be the selected column section further comprises:

selecting half of the first number of column sections, wherein the selected column section is interlaced with the unselected column section.

14. The memory-testing method of claim 11, wherein the step of selecting at least one of the row sections to be the selected row section further comprises:

selecting half of the second number of row sections, wherein the selected row section is interlaced with the unselected row section.

* * * * *